United States Patent [19]

Gazsi

[11] Patent Number: 5,075,679
[45] Date of Patent: Dec. 24, 1991

[54] ANALOG/DIGITAL CONVERTER CONFIGURATION WITH SIGMA-DELTA MODULATORS

[75] Inventor: Lajos Gazsi, Düsseldorf, Fed. Rep. of Germany

[73] Assignee: Siemens Aktiengesellschaft, Munich, Fed. Rep. of Germany

[21] Appl. No.: 625,207

[22] Filed: Dec. 10, 1990

[30] Foreign Application Priority Data

Dec. 8, 1989 [EP] European Pat. Off. ........ 89122683.9

[51] Int. Cl.[5] .............................................. H03M 3/02
[52] U.S. Cl. ..................................... 341/143; 341/155
[58] Field of Search ................. 341/143, 155, 159, 160

[56] References Cited

U.S. PATENT DOCUMENTS 4,951,052 8/1990 Jacob et al. ......................... 341/122
4,968,987 11/1990 Nafa et al. ........................... 341/143

FOREIGN PATENT DOCUMENTS 3337041 4/1985 Fed. Rep. of Germany .
2148638 10/1984 United Kingdom .

OTHER PUBLICATIONS

ICASSP 86, Proceedings, Apr. 7-11, 1986, IEEE New York, U.S., Taniguchi et al.
IEEE Journal of Solid-State Circuits, vol. 23, No. 3, Jun. 1988, New York, U.S., pp. 736-741; J. Robert et al.
ICASSP 88, Apr. 11-14, 1988, IEEE New York, U.S.: E. Dijkstra et al., pp. 2001-2004.
IEEE Transactions on Circuits and Systems, vol. CAS-25, No. 7, Jul. 1978, Tewksbury et al.
B. G. Teubner Stuttgart 1989, pp. 276-309, Lo Hess: "Digitale Filter".

Primary Examiner—J. R. Scott
Assistant Examiner—Marc S. Hoff
Attorney, Agent, or Firm—Herbert L. Lerner; Laurence A. Greenberg

[57] ABSTRACT

An analog/digital converter configuration includes sigma-delta modulators being triggered by an analog input signal and emitting digital output signals at a predetermined sampling rate. The sigma-delta modulators have input circuits with amplification factors. Amplifiers are each connected upstream of a respective one of the sigma-delta modulators. First sampling rate reducers are each connected downstream of a respective one of the sigma-delta modulators. Damping elements are each connected downstream of a respective one of the first sampling rate reducers. Each of the damping elements have a damping factor equal to the inverse of the amplification factor occurring in the input circuit of a corresponding one of the sigma-delta modulators. A priority logic is connected downstream of the damping elements. A second sampling rate reducer is connected downstream of the priority logic. An output is connected downstream of the second sampling rate reducer. The priority logic switches a signal from the first sampling rate reducers to the output after evaluation of signals from the first sampling rate reducers.

10 Claims, 2 Drawing Sheets

ANALOG/DIGITAL CONVERTER CONFIGURATION WITH SIGMA-DELTA MODULATORS

The invention relates to an analog/digital converter configuration.

In analog/digital converters, it is difficult to achieve both short conversion times and high resolution. Converters with high resolution, such as those operating by the counting method, usually have relatively long conversion times, while converters with very short conversion times, such as those operating by the parallel process, are limited in the resolution attainable, because the necessary circuitry increases virtually exponentially with the output word length. There are also various converters, such as those operating by the weighting method or by the expanded parallel process, that are intended as practical solutions to the problem, but that actually merely make compromises between the above two extremes.

German Patent DE 33 37 041 C1, corresponding to Published U.K. Application No. 2 148 638 A, discloses a circuit apparatus for digitizing analog signals having a plurality of analog/digital converters, which are preceded by amplifiers and can be switched through to the output through a priority logic. Converters that operate by the parallel process are used as the analog/digital converters in such a case. In that way a high conversion rate, a wide dynamic range and high resolution are attained.

Another alternative is analog/digital converters having oversampling and noise filtering. In that case a high sampling frequency, or in other words a short conversion time, is used rather than high resolution, and a low-frequency, high-resolution signal is obtained from the high-frequency, low-resolution signal in a subsequent digital filter. An essential advantage is that in contrast to the first converter types discussed above, complicated calibration and correction provisions are unnecessary in converters with oversampling and noise filtering, since the converter itself, because of its low resolution, which in many cases is only one bit, and the subsequent noise filter, because it is made by digital technology, have little or no sensitivity to manufacturing tolerances.

An analog/digital converter with oversampling and noise filtering is attained, for instance, with a sigma-delta modulator, having a sampling rate reducing device connected to the output side thereof. Analog/digital converters with oversampling and noise filtering are known, for instance, from the paper by Stuart K. Tewksbury and Robert W. Hallock entitled "Oversampled, Linear Predictive and Noise-Shaping Coders of Order $N>1$", published in IEEE Transactions on Circuits and Systems, Vol. CAS-25, No. 7, July 1978, page 436 ff. The construction of sampling rate reducers is described in the book by Wolfgang Heß entitled Digitale Filter [Digital Filters], 1st ed., 1989, page 277 ff, among other sources. A typical sigma-delta modulator, for instance, includes k analog integrators (making it a sigma-delta modulator of $k^{th}$ order) in series, followed by an analog/digital converter having a digital output signal which is reconverted into an analog output signal by a digital/analog converter. The analog output signal is then added to the input signal of each analog integrator. The digital output signal is supplied to a noise filter which, for instance, includes k series-connected digital integrators, that in turn is followed by a sampling rate reducer. In the sampling rate reducer, the signal having the sampling frequency which is to be reduced, first undergoes bandpass limitation with a low-pass filter. Next, the sampling frequency is lowered to $1/n$, by subtracting $n-1$ sampling values. The limit frequency of the low-pass filter is higher than or equal to twice the sampling frequency that has been lowered to $1/n$. The expense for circuitry can be reduced, for instance, by using a one-bit analog/digital converter, in other words a comparator, so that the digital/analog converter can then be replaced with a line.

However, the principle known from German Patent DE 33 37 041 C1, corresponding to Published U.K. Application No. 2 148 638 A, in combination with sigma-delta modulators cannot be used directly to increase the resolution. Problems arise especially in terms of the placement of the priority logic. Connecting the priority logic directly to the outputs of the sigma-delta modulators is not possible, because the respective output signals are present only in differential form, so that a direct conclusion as to whether the output signal is exceeding the range limits of the applicable sigma-delta modulator cannot be made. On the other hand, if the priority logic is connected to the output side of the sampling rate reducers, the signal delay through the low-pass filters of the sampling rate reducer likewise delays evaluation by the priority logic. As a result, if a range is exceeded it is not recognized until later. That can cause signal distortion or an unfavorable signal-to-noise ratio, for example.

It is accordingly an object of the invention to provide an analog/digital converter configuration having a plurality of sigma-delta modulators preceded by amplifiers, which overcomes the hereinafore-mentioned disadvantages of the heretofore-known devices of this general type.

With the foregoing and other objects in view there is provided, in accordance with the invention, an analog/digital converter configuration, comprising i sigma-delta modulators being triggered by an analog input signal and emitting digital output signals at a predetermined sampling rate, the sigma-delta modulators having input circuits with amplification factors, i amplifiers each being connected upstream of a respective one of the sigma-delta modulators, i first sampling rate reducers each being connected downstream of a respective one of the sigma-delta modulators, i damping elements each being connected downstream of a respective one of the first sampling rate reducers, each of the damping elements having a damping factor equal to the inverse of the amplification factor occurring in the input circuit of a respective or corresponding one of the sigma-delta modulators, a priority logic connected downstream of the damping elements, a second sampling rate reducer connected downstream of the priority logic, and an output connected downstream of the second sampling rate reducer, the priority logic switching a signal from the first sampling rate reducers to the output after evaluation of signals from the first sampling rate reducers.

In accordance with another feature of the invention, each two adjacent sigma-delta modulators are connected to one another through a respective one of the amplifiers, and all of the amplifiers have the same amplification factor.

In accordance with a further feature of the invention, the amplifiers upstream of the sigma-delta modulators are connected in parallel and have different amplification factors.

In accordance with an added feature of the invention, the amplification factor or factors of the amplifiers is or are a power of two.

In accordance with an additional feature of the invention, the amplifiers have amplification factors, the priority logic compares signals from the first sampling rate reducers with threshold values each being associated with the first sampling rate reducers, and one of the first sampling rate reducers having a signal not exceeding the threshold value and being connected to one of the amplifiers having the highest amplification factor, being switched through to the output by the priority logic.

In accordance with yet another feature of the invention, the amplifiers each have a modulation limit, and the threshold values are each equivalent to a modulation of a respective associated amplifier within the modulation limit of the respective amplifier.

In accordance with a concomitant feature of the invention, when a threshold value is exceeded, the priority logic performs a switchover from one of the sampling rate reducers to another in a delayed manner if one of the amplifiers associated with one of the first sampling rate reducers has a higher amplification factor than the amplifier associated with the other of the sampling rate reducers; and performs the switchover without delay if one of the amplifiers associated with one of the first sampling rate reducers has a lower amplification factor than the amplifier associated with the other of the sampling rate reducers.

The advantages of the invention are its markedly shorter delay time and less complicated circuitry.

Other features which are considered as characteristic for the invention are set forth in the appended claims.

Although the invention is illustrated and described herein as embodied in an analog/digital converter configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

Figure 1:
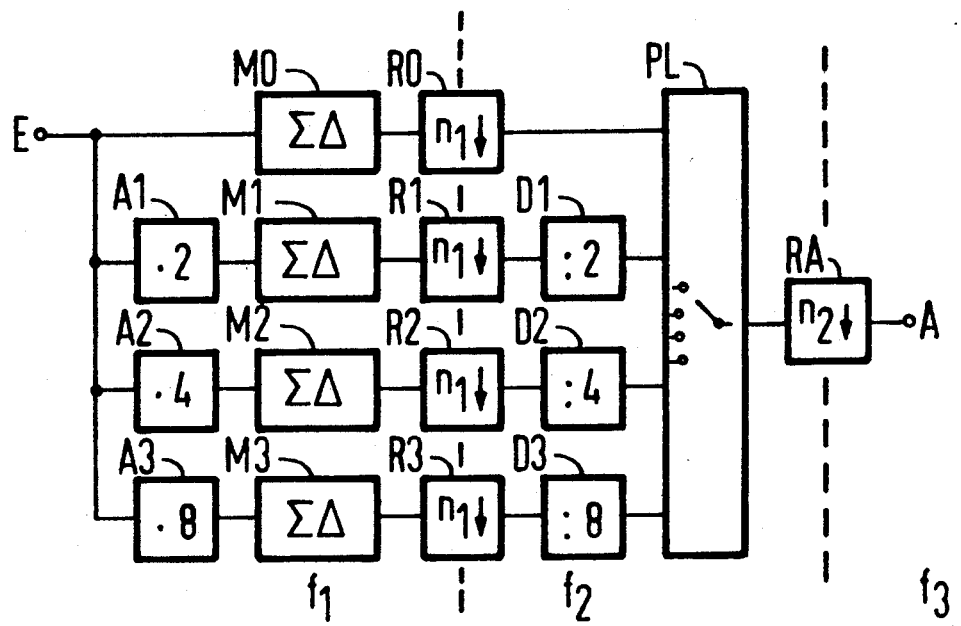
FIG. 1 is a block circuit diagram of a first basic embodiment of an analog/digital converter configuration according to the invention.
Figure 2:
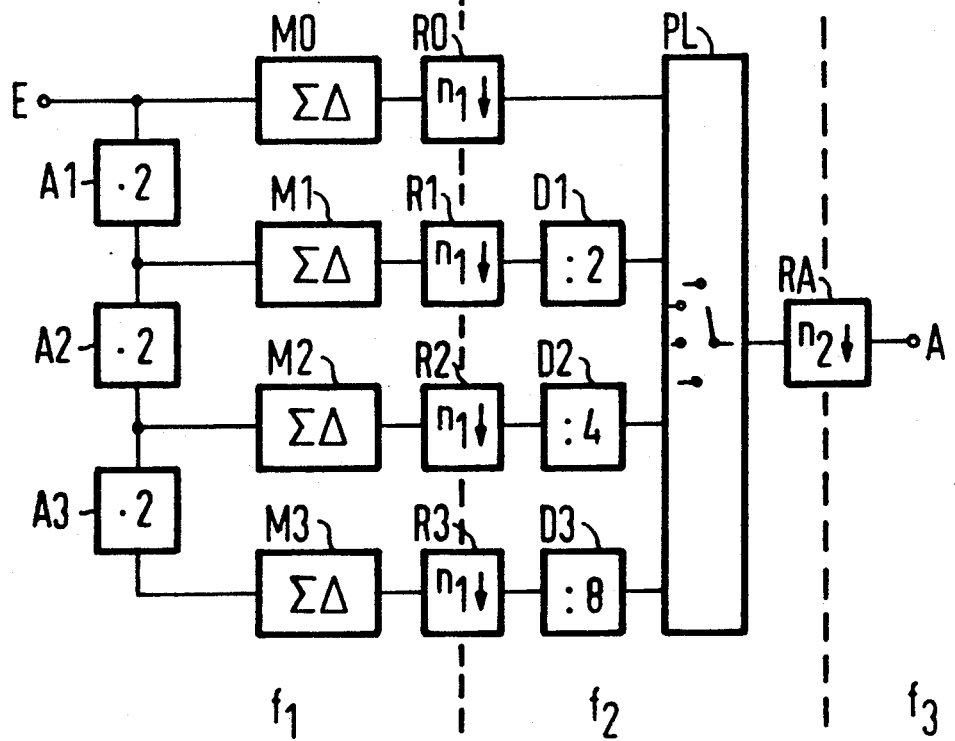
FIG. 2 is a block circuit diagram of a second basic embodiment of an analog/digital converter configuration according to the invention.

Referring now in detail to the figures of the drawing, in which identical elements have the same reference numerals, and first, particularly, to FIGS. 1 and 2 thereof, there are seen exemplary embodiments of the invention each having four sigma-delta modulators M0 ... M3, that are triggered by an analog input signal E and emit digital output signals at a given sampling rate $f_1$. The sigma-delta modulators M0 ... M3 are each followed by a respective first sampling rate reducer R0 ... R3, which performs low-pass filtering of the output signals of the various sigma-delta modulators M0 ... M3 and then lowers the sampling rate $f_1$ to $f_1/n_1$. Thus, digital signals having a sampling rate of $f_2=f_1/n_1$ are present at the outputs of the sampling rate reducers R0 ... R3. The low-pass filtering of the sampling rate reducers R0 ... R3 acts as both a bandpass limitation for the sampling rate reducer and a noise filter for the sigma-delta modulators. The sigma-delta modulators M1, M2, M3 are each preceded by a respective amplifier A1, A2, A3. The sampling rate reducers R1, R2, R3 are each followed by a respective digital damping element D1, D2, D3, having damping values which are equal to the total amplifications of the amplifiers A1, A2, A3 that precede the respective sigma-delta modulators M1, M2, M3. The outputs of the damping elements D1, D2, D3 and the output of the sampling rate reducer R0 are connected to a priority logic PL, having an output to which a second sampling rate reducer RA is connected. The sampling rate reducer RA lowers the sampling rate $f_2$ of the output signal of the priority logic to $f_2/n_2$, so that an output signal A of the analog/digital converter configuration has a sampling rate $f_3=f_2/n_2$.

In the exemplary embodiment of FIG. 1, the amplifiers A1, A2, A3 and the sigma-delta modulator M0 are connected in parallel at the input side, while in the exemplary embodiment of FIG. 2 the amplifiers A1, A2, A3 are connected in series. In other words, in FIG. 2, the input side of the amplifier A1 is connected parallel to the sigma-delta modulator M0, the amplifier A2 is connected to the output of the amplifier A1, and the amplifier A3 is connected to the output of the amplifier A2. In both cases, the amplifications are selected in such a way that the signals at the inputs of the sigma-delta modulators M0 ... M3 are amplified by a factor that is equal to a power of two, as compared with the input signal E. This is advantageous because the corresponding digital damping elements D1, D2, D3 then merely need to perform shift operations, which do not require such complicated circuitry. As a result, the amplifiers A1, A2, A3 of the exemplary embodiment of FIG. 1 have amplifications of 2, 4, 8, respectively, and in the exemplary embodiment of FIG. 2 each has an amplification of 2. A further result of this is an amplification or damping that is equal to 1 for an amplifier preceding the sigma-delta modulator M0, or for a sampling element following the sampling rate reducer R0. These elements can therefore be replaced with line bridges.

After evaluation of the signal amplitude of each sigma-delta modulator branch, the priority logic PL continuously selects whichever branch is within its given optimal operating range and switches it through to the output. The optimal operating range is between the overdrive, overamplification, overloading or overmodulation range and the range of low resolution and high noise imposition. For the greatest possible avoidance of overdriving by brief pulses, the switchover threshold is preferably located under the range limit by a certain factor.

Figure 3:
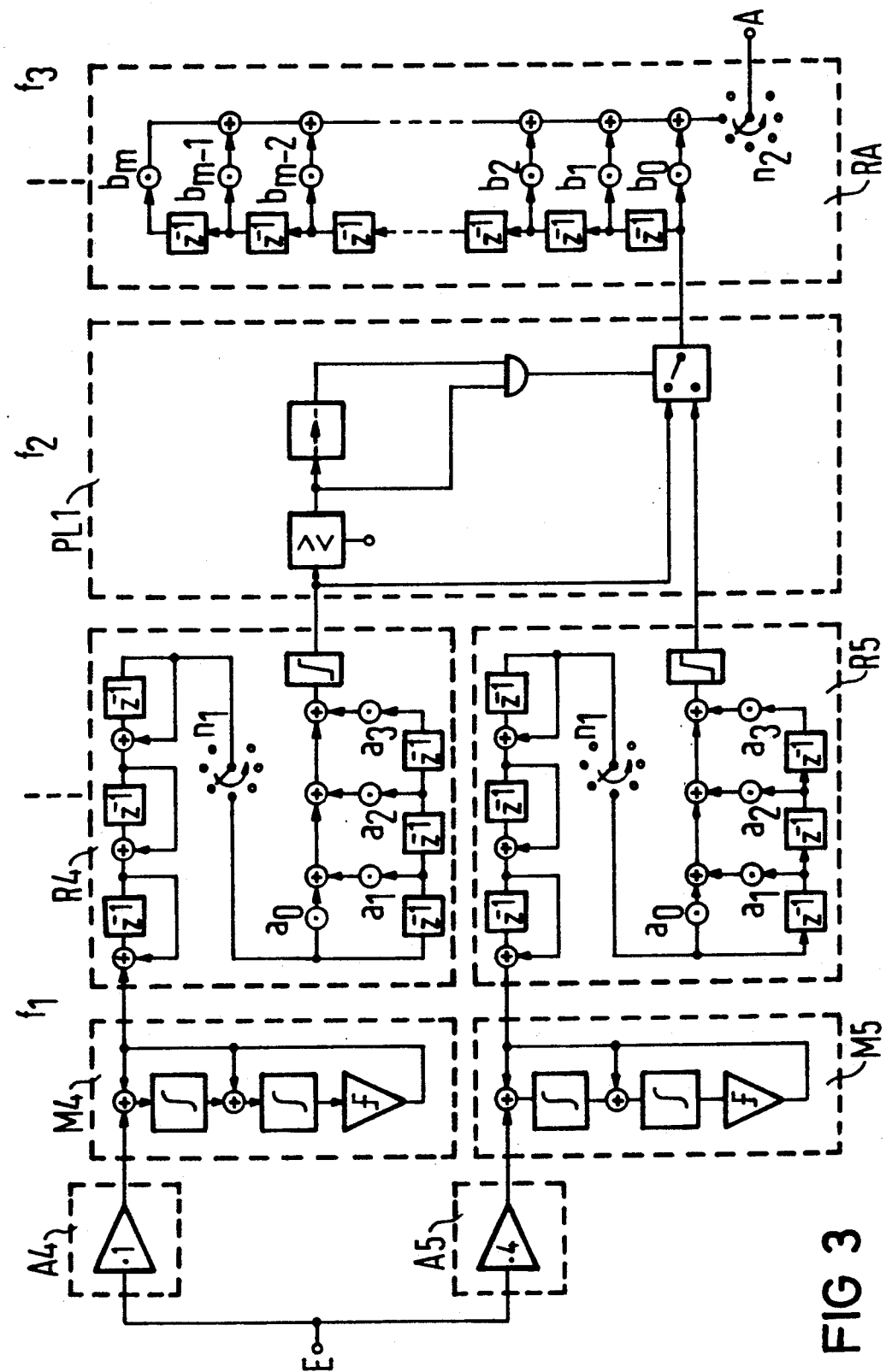
FIG. 3 is a schematic and block circuit diagram of a version of an analog/digital converter configuration having two sigma-delta modulators.

In the exemplary embodiment of FIG. 3, the analog input signal E is applied both to the input of an amplifier A4 and to the input of an amplifier A5. The amplifier A4 has an amplification of 1 and serves as a buffer amplifier. The amplifier A5 has an amplification of 4 and serves to shift the operating range of a sigma-delta modulator M5 connected to the output side thereof. The amplifier A4 is likewise followed by sigma-delta modulator, namely a sigma-delta modulator M4. Both sigma-delta modulators M4 and M5 are of the second order. The signal emitted by the respectively associated amplifier A4 or A5 is therefore integrated twice in each of the two sigma-delta modulators M4, M5. Prior to each integration, the output signal of the respective sigma-delta modulator is added as well, and then compared with a given threshold value. The outcome of this comparison, which is a larger than/smaller than comparison, is the output signal of the applicable sigma-delta modulator, digitally encoded with 1 bit.

First sampling rate reducers R4 and R5 are each connected to a respective sigma-delta modulator M4, M5. The digital output signals of the amplifiers A4 and A5 are first integrated three times, for example, by the respective sampling rate reducers R4 and R5. An individual integration is performed in such a way that the summation value thus far is added to the current amplitude value of a signal to be integrated, and then stored as the current summation value until the next sampling time. The integration or multiple integration increases the word length of the digital signal. In the present exemplary embodiment, the signal then includes 19 bits. Subsequently, by cyclical setting to 0 of $n_1 - 1$ sampling values and switching through of the $n_1$th sampling value, the sampling rate $f_1$ at the output of the sigma-delta modulators is lowered to $f_1/n_1$. All further operations are then performed with a sampling rate $f_2 = f_1/n_1$. Then the last signal value, multiplied by a factor $a_1$; the next-to-last signal value, multiplied by a factor $a_2$; and the third-from-last signal value, multiplied by a factor $a_3$, are all added to the current signal value, multiplied by a factor $a_0$. Finally, the maximum amplitude of the signal is limited. To this end, if the representable value range of the signal has been adhered to, the signal is passed on unchanged, or if the representable value range has been exceeded, the signal is set to a maximum value, with the same algebraic sign, and passed on. This avoids the generation of inapplicable signal values in the event that the modulation limit of the sigma-delta modulator and/or the integrators of the representable value range of the signal is exceeded.

The outputs of the two sampling rate reducers R4, R5 are connected to a priority logic PL1. The priority logic PL1 compares the amplitude value of the signal at the output of the sampling rate reducer R4 with a threshold value. A threshold value comparison can be made, among other ways, by first checking the three most significant bits, using a triple OR gate, to see whether they have been set. If so, the thereby defined threshold value has been exceeded. If the amplitude value in the stationary case is higher than the threshold value, then the sampling rate reducer R4 is switched through to the output. If this value is lower, then the sampling rate reducer R5 is switched through. If the threshold value is exceeded, the priority logic PL switches immediately, while if the signal fails to attain the threshold, it switches only after a certain delay, for instance after a certain number of sampling times has elapsed. The advantage of this is that any analog amplifier overdriven at a given time is provided with a certain amount of recovery time. An overdriven analog amplifier typically does not resume linear operation until a certain amount of time after the overdriving has ended.

The present exemplary embodiment does not explicitly show any damping elements. Instead, a damping adaptation was performed by increasing the word width of the signal from 18 bits to 20 bits. In the priority logic PL, in one case, the 18 bits of the output signal of the sampling rate reducer R4 become the 18 most significant bits of the 20-bit signal, and the two least significant bits are set equal to 0, while in the other case the 17 bits of the output signal of the sampling rate reducer R5 become the 17 least significant bits, and the two most significant bits of the 20 bit signal (bits 18 and 19) are set equal to zero, while the algebraic sign is maintained unchanged. This means that the most significant bit of the 20-bit signal is set equal to the most significant bit of the output signal of the sampling rate reducer R5.

The priority logic PL is followed in turn by a second sampling rate reducer RA. In the exemplary embodiment shown, this device has a non-recursive low-pass filter, in contrast to the recursive low-pass filters of the sampling rate reducers R4 and R5. However, it is equally possible to use a recursive low-pass filter, such as a wave digital filter. It is also equally possible to use non-recursive filters in the first sampling rate reducers R4 and R5. In the non-recursive low-pass filter of the sampling rate reducer RA, the variously delayed input signals are each first multiplied by coefficients $b_0 \ldots b_m$ and added together. The particular preferred filter behavior in this case is that of a split low-pass filter. Next, by cyclical setting to zero of $n_2 - 1$ sampling values and switching through of the $n_2$th sampling value, the sampling rate $f_2$ is again lowered to $f_2/n_2$. The sampling rate $f_3$ at the output A thus amounts to $f_3 = f_2/n_2$.

Further features of an analog/digital converter configuration according to the invention are obtained, for instance, by changing the circuit structure or the order of the sigma-delta modulators, and by changing the filter structures in the various sampling rate reducers. A function-specific hardware version is one possibility in the analog/digital converter configuration according to the invention, but the use of one or more signal processors for digital signal processing following the sigma-delta modulators is also possible.

Especially because of the capacity for floating point representation of the digital output signals, analog/digital converter configurations according to the invention have high resolution and a high conversion speed, yet relatively uncomplicated circuitry. Above all, the complexity of the circuitry is less because the sampling rate reducers that directly follow the sigma-delta modulators can be relatively uncomplicated, while the sampling rate reducer following the priority logic can be substantially more complicated and therefore precise. The circuitry is less complicated overall, because in contrast to the other sampling rate reducers, only one of these more complicated devices is needed. The signal delay time through the low-pass filters of the first sampling rate reducers is shorter, because they have a higher limit frequency as a result of the higher sampling rate $f_2$ as compared with the sampling rate $f_3$, and a resultant faster response of the priority logic is attained.

I claim:

1. Analog/digital converter configuration, comprising:

i sigma-delta modulators each having an output and being triggered by an analog input signal and emitting digital output signals at a predetermined sampling rate, said sigma-delta modulators having input circuits with amplification factors and i being a positive integer, i amplifiers each being connected to the input circuit of a respective one of said sigma-delta modulators, i first sampling rate reducers each having an input and an output and each being connected to the output of a respective one of said sigma-delta modulators, i damping elements each having an input and an output and each being connected to the output of a respective one of said first sampling rate reducers, each of said damping elements having a damping factor equal to the inverse of the amplification factor occurring in the input circuit of a respective one of said sigma-delta modulators, a priority logic circuit having an input and an output, said priority logic circuit being connected to the output of said damping elements, a second sampling rate reducer connected to the output of said priority logic circuit, and said second sampling rate reducer having an output, said priority logic circuit switching a signal from said first sampling rate reducers to said output after evaluation of signals from said first sampling rate reducers.

2. Analog/digital converter according to claim 1, wherein each two adjacent sigma-delta modulators are connected to one another through a respective one of said amplifiers, and all of said amplifiers have the same amplification factor.

3. Analog/digital converter according to claim 2, wherein the amplification factor of said amplifiers is a power of two.

4. Analog/digital converter according to claim 1, wherein said amplifiers to the input of said sigma-delta modulators are connected in parallel and have different amplification factors.

5. Analog/digital converter according to claim 4, wherein the amplification factors of said amplifiers are powers of two.

6. Analog/digital converter according to claim 1, wherein said amplifiers have amplification factors, said priority logic circuit compares signals from said first sampling rate reducers with threshold values each being associated with said first sampling rate reducers, and one of said first sampling rate reducers having a signal not exceeding the threshold value and being connected to one of said amplifiers having the highest amplification factor, being switched through to said output by said priority logic circuit.

7. Analog/digital converter according to claim 6, wherein said amplifiers each have a modulation limit, and the threshold values are each equivalent to a modulation of a respective associated amplifier within the modulation limit of said respective amplifier.

8. Analog/digital converter according to claim 6, wherein when a threshold value is exceeded, said priority logic circuit performs a switchover from one of said sampling rate reducers to another in a delayed manner if one of said amplifiers associated with one of said first sampling rate reducers has a higher amplification factor than said amplifier associated with the other of said sampling rate reducers; and performs the switchover without delay if one of said amplifiers associated with one of said first sampling rate reducers has a lower amplification factor than said amplifier associated with the other of said sampling rate reducers.

9. Analog/digital converter configuration, comprising:

a plurality of sigma-delta modulators being triggered by an analog input signal and emitting digital output signals at a predetermined sampling rate, said sigma-delta modulators having input circuits with amplification factors and outputs, a plurality of amplifiers each being connected to the input circuit of a respective one of said sigma-delta modulators, a plurality of first sampling rate reducers each having an input and an output and each being connected to the output of a respective one of said sigma-delta modulators, a plurality of damping elements each having an input and an output and each being connected to the output of a respective one of said first sampling rate reducers, each of said damping elements having a damping factor equal to the inverse of the amplification factor occurring in the input circuit of a respective one of said sigma-delta modulators, a priority logic circuit having an input and an output, said priority logic circuit being connected to the output of said damping elements, a second sampling rate reducer connected to the output of said priority logic circuit, and said second sampling rate reducer having an output, said priority logic circuit switching a signal from said first sampling rate reducers to said output after evaluation of signals from said first sampling rate reducers.

10. Analog/digital converter configuration, comprising:

i sigma-delta modulators each having an output and each being triggered by an analog input signal and emitting digital output signals at a predetermined sampling rate, said sigma-delta modulators having input circuits with amplification factors and i being a positive integer, i amplifiers each connected to the input circuit of a respective one of said sigma-delta modulators, i first sampling rate reducers each having an input and an output and each being connected to the output of a respective one of said sigma-delta modulators, means for damping with a damping factor equal to the inverse of the amplification factor occurring in the input circuit of a respective one of said sigma-delta modulators, a priority logic circuit having an input and an output, said priority logic circuit being connected to the output of said first sampling rate reducers, a second sampling rate reducer connected to the output of said priority logic circuit, and said second sampling rate reducer having an output, said priority logic circuit switching a signal from said first sampling rate reducers to said output after evaluation of signals from said first sampling rate reducers.

* * * * *